United States Patent [19]

Chung et al.

[11] Patent Number: 5,717,650
[45] Date of Patent: Feb. 10, 1998

[54] ROW/COLUMN DECODER CIRCUITS FOR A SEMICONDUCTOR MEMORY DEVICE

[75] Inventors: In Sool Chung; Jae Jin Lee, both of Ichon, Rep. of Korea

[73] Assignee: Hyundai Electronics Industries Co., Ltd., Kyoungki-do, Rep. of Korea

[21] Appl. No.: 778,720

[22] Filed: Dec. 27, 1996

[30] Foreign Application Priority Data

Dec. 29, 1995 [KR] Rep. of Korea .................. 95-66050

[51] Int. Cl.$^6$ .................. G11C 7/00; G11C 8/00
[52] U.S. Cl. .................. 365/230.06; 365/227
[58] Field of Search .................. 365/230.06, 230.08, 365/226, 227, 189.09, 189.11

[56] References Cited

U.S. PATENT DOCUMENTS

| | | |
|---|---|---|
| 4,618,784 | 10/1986 | Chappell et al. .................. 307/449 |
| 5,140,557 | 8/1992 | Yoshida .................. 365/226 |
| 5,373,479 | 12/1994 | Noda .................. 365/230.06 |
| 5,463,583 | 10/1995 | Takashina .................. 365/230.06 |
| 5,550,504 | 8/1996 | Ogihara .................. 327/537 |

Primary Examiner—David C. Nelms
Assistant Examiner—Son Mai
Attorney, Agent, or Firm—Reid & Priest LLP

[57] ABSTRACT

Row/column decoder circuits for a semiconductor memory device. Switching elements are used to separate a main power line from the row decoder circuit to block power from the main power line to the row decoder circuit when a word line is not driven. Therefore, the amount of standby current consumption can be reduced. Also, switching elements are used to separate a main power line from the column decoder circuit to block power from the main power line to the column decoder circuit when a bit line is not selected. Therefore, the amount of standby current consumption can be reduced.

19 Claims, 4 Drawing Sheets

ROW/COLUMN DECODER CIRCUITS FOR A SEMICONDUCTOR MEMORY DEVICE

BACKGROUND OF THE INVENTION

1. Field of the Invention

The present invention relates in general to a semiconductor memory device, and more particularly to row/column decoder circuits for a dynamic random access memory (referred to hereinafter as DRAM), in which switching elements are used to separate a main power line from the row/column decoder circuits to block power from the main power line to the row/column decoder circuits when word and bit lines are not driven, so that the amount of standby current consumption can be reduced.

2. Description of the Prior Art

Generally, a DRAM comprises a cell array block for storing data therein. The cell array block includes word and bit lines interconnected in the form of a net, with a plurality of memory cells connected to the word and bit lines. Each of the memory cells is provided with one NMOS transistor and one capacitor.

A row decoder is used in the DRAM to select a desired word line in the cell array block. Namely, the row decoder selects one of the word lines in the cell array block corresponding to an input row address. Such a conventional row decoder circuit will hereinafter be described with reference to FIG. 1.

FIG. 1 is a circuit diagram illustrating the construction of a conventional row decoder circuit for driving word lines in a semiconductor memory device. As shown in this drawing, the conventional row decoder circuit comprises one main row decoder 10 and four sub row decoders 20__1-20__4.

The main row decoder 10 includes PMOS transistors MP1 and MP2 connected in parallel between a supply voltage Vcc and a node N1, and NMOS transistors MN1-MN3 connected in series between the node N1 and a ground voltage Vss. The PMOS transistor MP1 has its gate for inputting a control signal xdp and the PMOS transistor MP2 has its gate connected to a node N2. The NMOS transistors MN1-MN3 have their gates for inputting row address bits ax23, ax45 and ax67, respectively. The main row decoder 10 further includes an inverter circuit 11 connected between the nodes N1 and N2, and an inverter circuit 12 connected between the node N2 and a node N4. The inverter circuit 11 includes a PMOS transistor MP3 connected between the supply voltage Vcc and the node N2, and an NMOS transistor MN4 connected between the node N2 and the ground voltage Vss. The PMOS and NMOS transistors MP3 and MN4 have their gates connected in common to the node N1. The inverter circuit 12 includes a PMOS transistor MP4 connected between the supply voltage Vcc and the node N4, and an NMOS transistor MN5 connected between the node N4 and the ground voltage Vss. The PMOS and NMOS transistors M4 and MN5 have their gates connected in common to the node N2.

Each of the sub row decoders 20__1-20__4 includes a bootstrap transistor or NMOS transistor MN6 connected between the node N2 and a bootstrap node N3, a high voltage transfer transistor or NMOS transistor MN7 connected between a word line boosting signal pxi and a node N5 connected to a corresponding word line WL, and a low voltage transfer transistor or NMOS transistor MN8 connected between the node N5 and the ground voltage Vss. The bootstrap transistor MN6 has its gate connected to the supply voltage Vcc and the high voltage transfer transistor MN7 has its gate connected to the bootstrap node N3. The low voltage transfer transistor MN8 has its gate connected to the node N4.

The operation of the conventional row decoder circuit with the above-mentioned construction will hereinafter be described.

For example, in the case where only the main row decoders 10 are used under the condition that n word lines are present in one cell array block, they must be n in number to select one of the n word lines. Under these circumstances, because the main row decoders 10 are very large in occupying area, they are hard to use in a highly integrated semiconductor memory device.

Therefore, the conventional row decoder circuit as shown in FIG. 1 has been proposed in order to solve such a problem. In FIG. 1, at least two sub row decoders 20__1-20__4 are connected to one main row decoder 10 to decode the word line boosting signal pxi at the drains of the high voltage transfer transistors MN7 therein.

In FIG. 1, four sub row decoders 20__1-20__4 are connected to one main row decoder 10 and a boosted high voltage Vpp is transferred as the word line boosting signal pxi to only one of the sub row decoders 20__1-20__4. In this case, because four sub row decoders 20__1-20__4 are connected to each main row decoder 10 under the condition that n word lines are present in each cell array block, n/4 main row decoders 10 are required for each cell array block, resulting in a reduction in occupying area.

On the other hand, in the case where an NMOS transistor is used as a DRAM cell transistor, a word line enable voltage higher than the supply voltage Vcc is used to transfer high level data well. The reason is that the NMOS transistor used as the DRAM cell transistor is limited in voltage transfer capability due to a threshold voltage thereof.

In other words, in the case where a gate voltage to the NMOS transistor has the supply voltage level Vcc, a high voltage transferable by the NMOS transistor is Vcc-Vtn (the threshold voltage of the NMOS transistor). For this reason, a voltage higher than the supply voltage Vcc must be applied to the gate of the NMOS transistor to compensate for a voltage drop due to the threshold voltage Vtn of the NMOS transistor.

However, in this case, means for making a gate voltage to the high voltage transfer transistor MN7 in the sub row decoder 20 higher than the high voltage Vpp for the compensation for the transfer characteristic (Vcc-Vtn) of the NMOS transistor when the high voltage Vpp is transferred to the corresponding word line are required. Such means are the bootstrap transistor MN6 in the sub row decoder 20.

The operation of selecting a desired word line and transferring the high voltage Vpp to the selected word line will now be discussed.

One of the main row decoders 10 associated with the desired word line is selected by the row address bits ax23, ax45 and ax67. In the selected main row decoder 10, the supply voltage Vcc is transferred to the output node N2, thereby causing a voltage (Vcc-Vtn) to be transferred to the bootstrap nodes N3 in the sub row decoders 20__1-20__4 connected to the selected main row decoder 10, when a gate voltage to the bootstrap transistor MN6 in each sub row decoder 20 has the supply voltage level Vcc, where Vtn is a threshold voltage of the bootstrap transistor MN6.

Then, a high voltage transfer decoder (not shown) transfers the word line enable voltage Vpp as the word line boosting signal pxi corresponding to the desired word line.

For example, in the case where the word line boosting signal px0 is selected by the high voltage transfer decoder, it is changed from the ground voltage level Vss to the word line enable voltage level Vpp. As a result, the voltage (Vcc-Vtn) at the gate node N3 of the high voltage transfer transistor MN7 is raised to the high voltage level Vpp or more because of a capacitance between the high voltage transfer node px0 and the gate node N3 of the high voltage transfer transistor MN7, thereby causing the word line enable voltage Vpp at the high voltage transfer node px0 to be transferred to the desired word line WL0.

Noticeably, in the case where the main row decoder 10 is not selected, the voltage at the bootstrap node N3 has the ground voltage level Vss. As a result, the bootstrapping phenomenon does not occur because the high voltage transfer transistor MN7 in the sub row decoder 20 produces a small capacitance. Further, when the high voltage transfer node pxi has the ground voltage level Vss under the condition that the main row decoder 10 is selected, the corresponding word line is not enabled.

However, in the above-mentioned conventional row decoder circuit, in the case where no power is supplied from a power line, a voltage at the node N4 which transfers a control signal to the gate of the low voltage transfer transistor MN8 in the sub row decoder 20 gradually becomes lower from the supply voltage level Vcc with the lapse of time. For this reason, because the word line WL is not stably maintained at the ground voltage state Vss, it may enter a floating state, resulting in the generation of leakage current in the DRAM cell.

SUMMARY OF THE INVENTION

Therefore, the present invention has been made in view of the above problem, and it is an object of the present invention to provide a row decoder circuit for a DRAM, in which switching elements are used to separate a main power line from the row decoder circuit to block power from the main power line to the row decoder circuit when a word line is not driven, so that the amount of standby current consumption can be reduced.

Another object of the present invention is to provide a column decoder circuit for a DRAM, in which switching elements are used to separate a main power line from the column decoder circuit to block power from the main power line to the column decoder circuit when a bit line is not selected, so that the amount of standby current consumption can be reduced.

In accordance with one aspect of the present invention, there is provided a row decoder circuit for a semiconductor memory device which has a plurality of memory cells each including one MOS transistor and one capacitor comprising main row decoding means for decoding a row address to select a word line corresponding to the row address; at least two sub row decoding means for supplying a high or low voltage to corresponding word lines in response to an output signal from the main row decoding means; a first power line acting as a source of a supply voltage; a second power line for transferring the supply voltage from the first power line to the main row decoding means; first switching means connected between the first and second power lines; second switching means for switching a corresponding word line to a ground voltage when the first switching means is turned off; and switching control means for controlling the first and second switching means.

In accordance with another aspect of the present invention, there is provided a row decoder circuit for a semiconductor memory device which has a plurality of memory cells each including one MOS transistor and one capacitor, comprising main row decoding means for decoding a row address to select a word line corresponding to the row address and outputting the decoded result to a first or second node; at least two sub row decoding means each including a high voltage transfer driver for transferring a high voltage to a corresponding word line in response to a signal at the first node, and a low voltage transfer driver for transferring a low voltage to the corresponding word line in response to a signal at the second node; a first power line acting as a source of a supply voltage; a second power line for transferring the supply voltage from the first power line to the main row decoding means; first switching means connected between the first and second power lines; second switching means for transferring the signal at the second node to the low voltage transfer driver when the first switching means is turned on; first switching control means for controlling the second switching means; and second switching control means for controlling the first switching means and the first switching control means.

In accordance with yet another aspect of the present invention, there is provided a column decoder circuit for a semiconductor memory device which has a plurality of memory cells each including one MOS transistor and one capacitor, comprising a pair of data transfer transistors for transferring data from true and complementary bit lines to true and complementary data bus lines or vice versa, respectively; column decoding means for decoding a column address to control the data transfer transistors; a first power line acting as a source of a supply voltage; a second power line for transferring the supply voltage from the first power line to the column decoding means; first switching means connected between the first and second power lines; second switching means for switching an output node of the column decoding means to a ground voltage when the first switching means is turned off; and switching control means for controlling the first and second switching means.

BRIEF DESCRIPTION OF THE DRAWINGS

The above and other objects, features and advantages of the present invention will be more clearly understood from the following detailed description taken in conjunction with the accompanying drawings, in which.

DETAILED DESCRIPTION OF THE PREFERRED EMBODIMENTS

Figure 1:
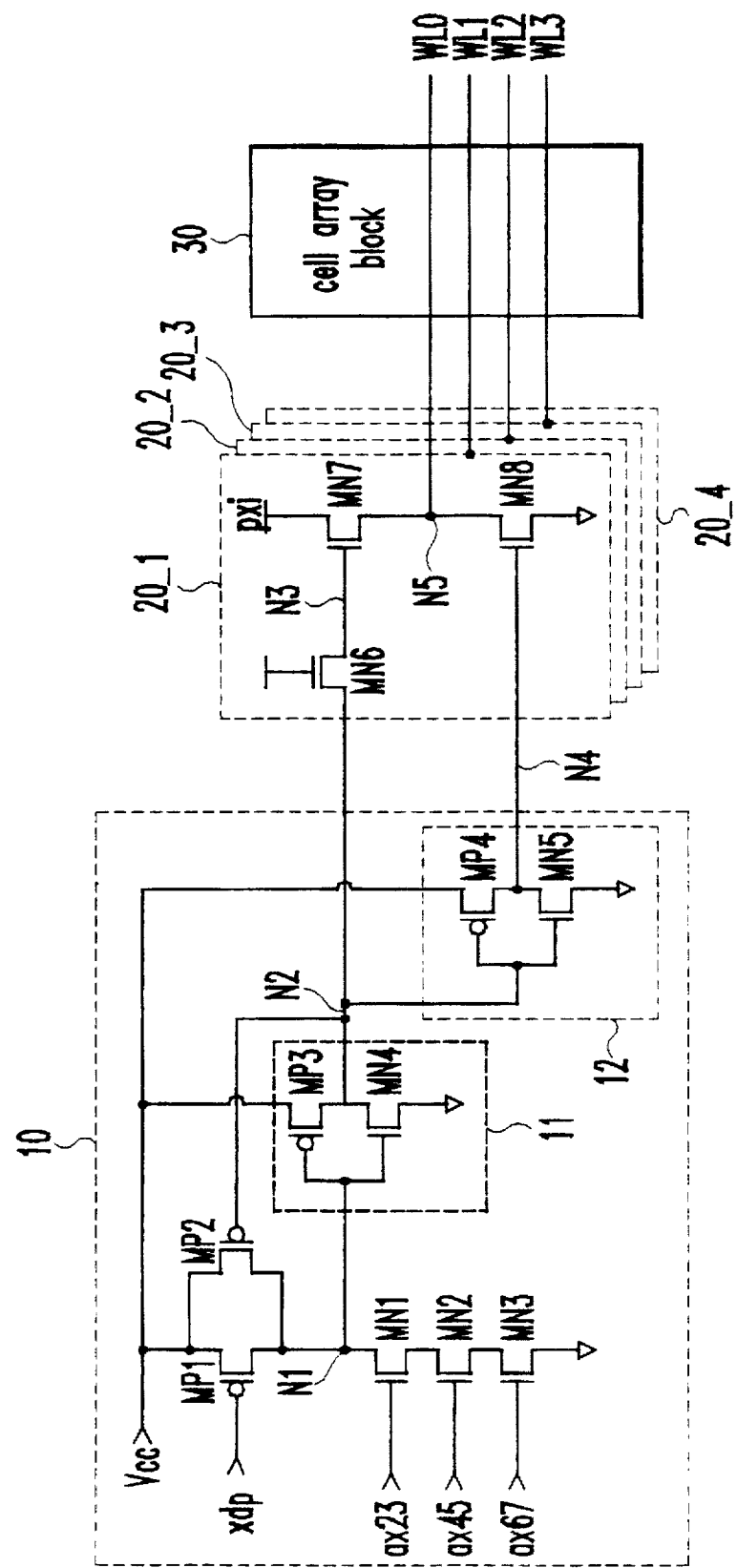
FIG. 1 is a circuit diagram illustrating the construction of a conventional row decoder circuit for driving word lines in a semiconductor memory device.
Figure 2:
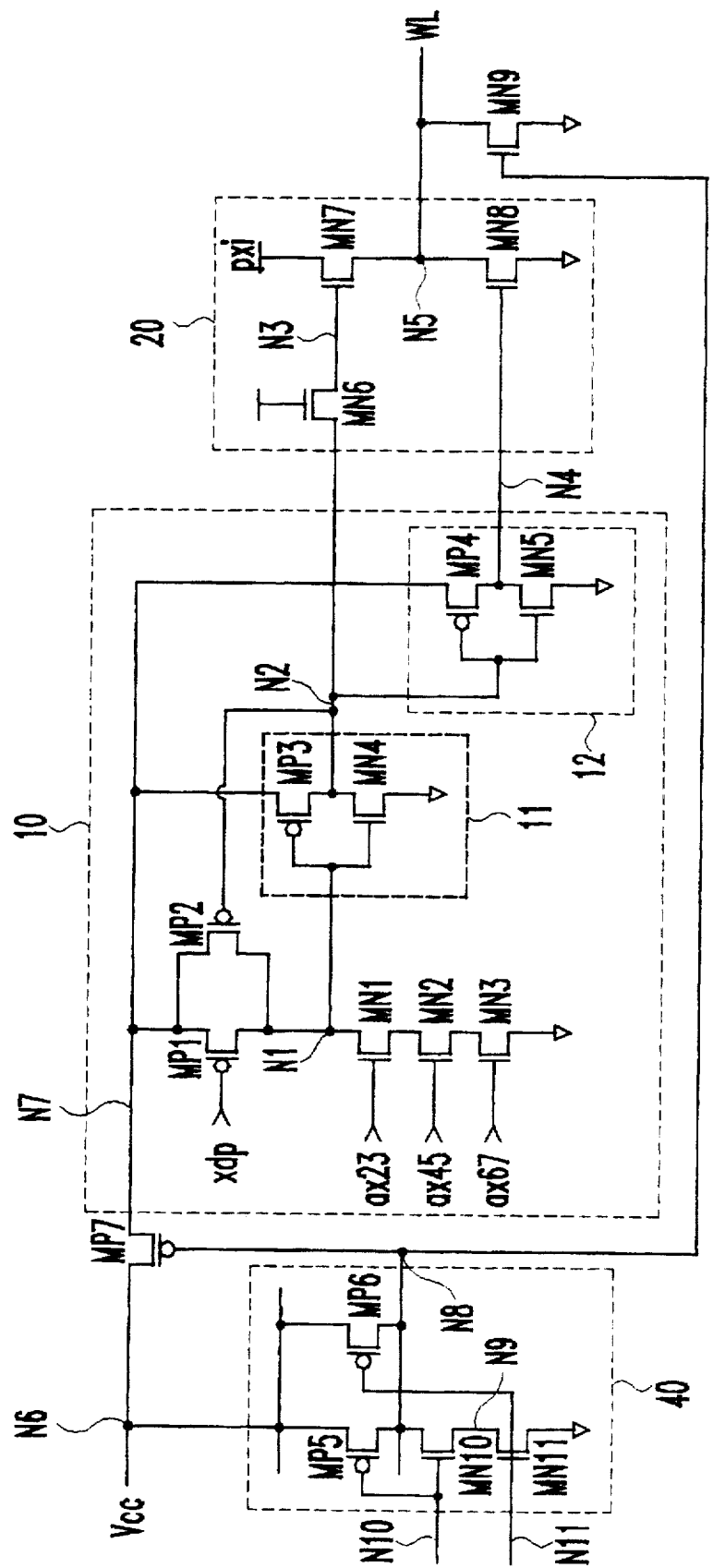
FIG. 2 is a circuit diagram illustrating the construction of a row decoder circuit for a semiconductor memory device in accordance with a first embodiment of the present invention.

FIG. 2 is a circuit diagram illustrating the construction of a row decoder circuit for a semiconductor memory device in accordance with a first embodiment of the present invention. Some parts in this drawing are substantially the same as those in FIG. 1. Thus, like reference numerals designate like parts.

As shown in FIG. 1, the row decoder circuit comprises a main row decoder 10 for decoding a row address to select a word line corresponding to the row address, and a plurality of sub row decoders 20 for supplying a high or low voltage to corresponding word lines in response to an output signal from the main row decoder 10.

The main row decoder 10 includes a voltage divider for supplying divided voltage to a first node N1. To this end, the voltage divider is provided with a plurality of MOS transistors connected in series between a supply voltage Vcc and a ground voltage Vss. The main row decoder 10 further includes a first inverter circuit 11 for inverting an output signal from the voltage divider and outputting the inverted signal to a second node N2, and a second inverter circuit 12 for inverting an output signal from the first inverter circuit 11 and outputting the inverted signal to a fourth node N4. The first inverter circuit 11 includes a PMOS transistor MP3 connected between the supply voltage Vcc and the second node N2, and an NMOS transistor MN4 connected between the second node N2 and the ground voltage Vss. The PMOS and NMOS transistors MP3 and MN4 have their gates connected in common to the first node N1. The second inverter circuit 12 includes a PMOS transistor MP4 connected between the supply voltage Vcc and the fourth node N4, and an NMOS transistor MN5 connected between the fourth node N4 and the ground voltage Vss. The PMOS and NMOS transistors MP4 and MN5 have their gates connected in common to the second node N2.

Each of the sub row decoders 20 includes a bootstrap transistor or NMOS transistor MN6 connected between the second node N2 and a third node N3, a high voltage transfer transistor or NMOS transistor MN7 connected between a word line boosting signal pxi and a fifth node N5 connected to a corresponding word line WL, and a low voltage transfer transistor or NMOS transistor MN8 connected between the fifth node N5 and the ground voltage Vss. The bootstrap transistor MN6 has its gate connected to the supply voltage Vcc, the high voltage transfer transistor MN7 has its gate connected to the third node N3, and the low voltage transfer transistor MN8 has its gate connected to the fourth node N4.

The row decoder circuit 20 further comprises a switching transistor or PMOS transistor MP7 connected between a sixth node N6 which is connected to a power line acting as a source of the supply voltage Vcc and a seventh node N7 which is connected to a power line for transferring the supply voltage Vcc from the sixth node N6 to the main row decoder 10, and has its gate connected to an eighth node N8, a low voltage transfer transistor or NMOS transistor MN9 connected between the fifth node N5 and the ground voltage Vss and has its gate connected to the eighth node N8, and a NAND gate 40 for supplying the supply voltage Vcc or the ground voltage Vss to the eighth node N8 in response to two row address bits at tenth and eleventh nodes N10 and N11.

The NAND gate 40 includes PMOS transistors MP5 and MP6 connected in parallel between the sixth and eighth nodes N6 and N8, an NMOS transistor MN10 connected between the eighth node N8 and a ninth node N9, and an NMOS transistor MN11 connected between the ninth node N9 and the ground voltage Vss. The PMOS transistor MP5 has its gate connected to the tenth node N10 and the PMOS transistor MP6 has its gate connected to the eleventh node N11. The NMOS transistor MN10 has its gate connected to the tenth node N10 and the NMOS transistor MN11 has its gate connected to the eleventh node N11.

The operation of the row decoder circuit with the above-mentioned construction in accordance with the first embodiment of the present invention will hereinafter be described in detail.

In the case where the word line WL is not driven, signals at the tenth and eleventh nodes N10 and N11 become low in logic. As a result, the NAND gate 40 transfers the supply voltage Vcc to the eighth node N8 to turn off the switching transistor MP7 connected between the sixth and seventh nodes N6 and N7. Also, the supply voltage Vcc at the eighth node N8 turns on the low voltage transfer transistor MN9 connected between the fifth node N5 and the ground voltage Vss. Therefore, the word line WL can stably be maintained at the ground voltage state Vss.

Figure 3:
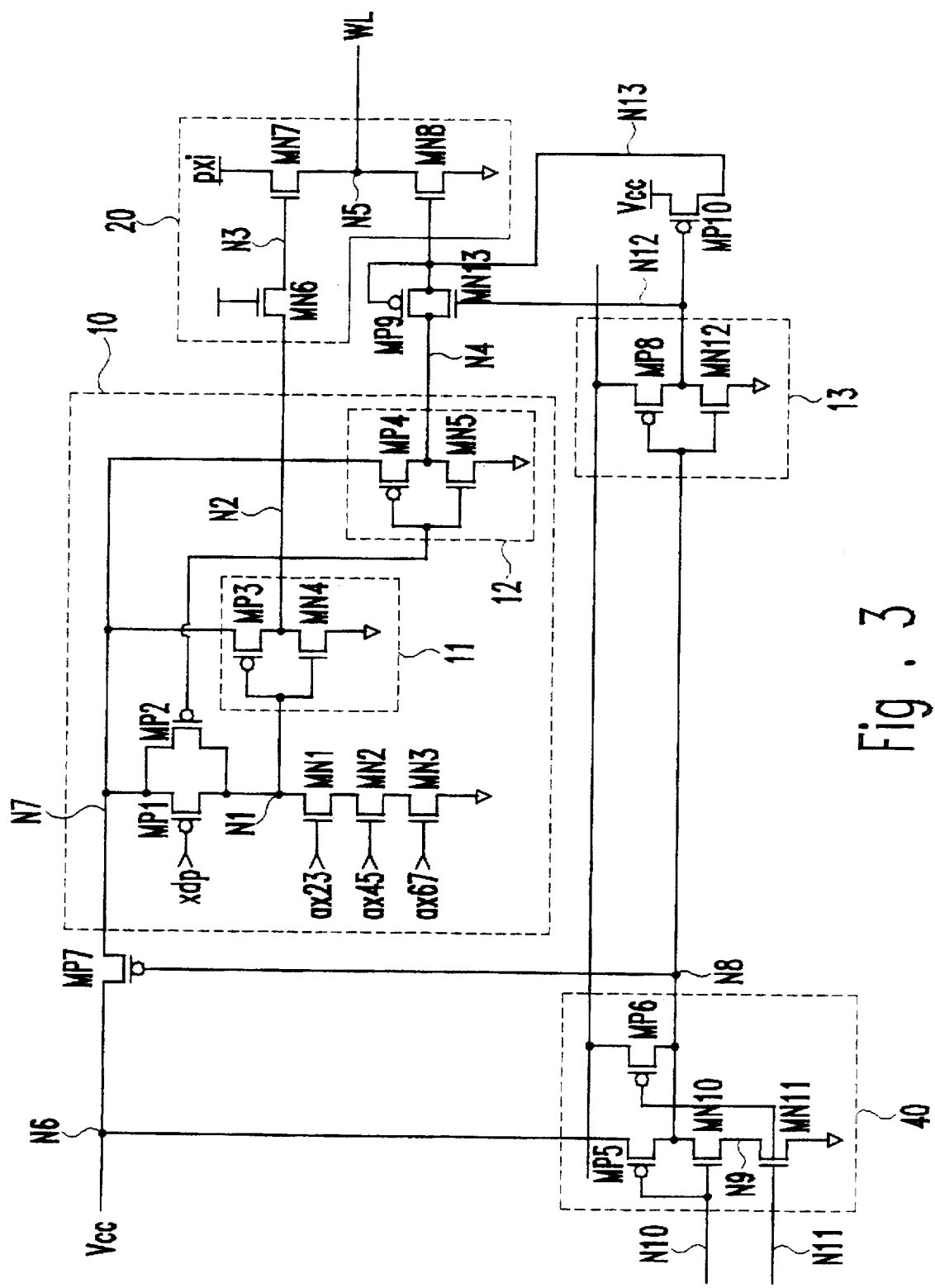
FIG. 3 is a circuit diagram illustrating the construction of a row decoder circuit for a semiconductor memory device in accordance with a second embodiment of the present invention.

FIG. 3 is a circuit diagram illustrating the construction of a row decoder circuit for a semiconductor memory device in accordance with a second embodiment of the present invention. The construction of the second embodiment is substantially the same as that of the first embodiment, with the exception that means for controlling a signal at the fourth node N4 which is applied to the gate of the low voltage transfer transistor MN8 in the sub row decoder 20 is provided instead of the low voltage transfer transistor MN9 connected between the fifth node N5 and the ground voltage Vss. The control means is adapted to control the signal at the fourth node N4 in response to the signal at the eighth node N8 which is supplied from the NAND gate 40.

The control means include a transfer gate connected between the fourth node N4 or output node of the second inverter circuit 12 in the main row decoder 10, a thirteenth node N13 which is connected to the gate of the low voltage transfer transistor MN8 in the sub row decoder 20, a third inverter circuit 13 for inverting the signal at the eighth node N8 and outputting the inverted signal to a twelfth node N12, and a PMOS transistor MP10 connected between the supply voltage Vcc and the thirteenth node N13 and has its gate connected to the twelfth node N12. The transfer gate is provided with a PMOS transistor MP9 connected between the fourth node N4 and the thirteenth node N13 and having its gate connected to the thirteenth node N13, and an NMOS transistor MN13 connected between the fourth node N4 and the thirteenth node N13 and having its gate connected to the twelfth node N12. The third inverter circuit 13 includes a PMOS transistor MP8 connected between the sixth node N6 and the twelfth node N12 and has its gate connected to the eighth node N8, and an NMOS transistor MN12 connected between the twelfth node N12 and the ground voltage Vss and has its gate connected to the eighth node N8.

The operation of the row decoder circuit with the above-mentioned construction in accordance with the second embodiment of the present invention will hereinafter be described in detail.

In the case where the word line WL is not driven, the signals at the tenth and eleventh nodes N10 and N11 become low in logic. As a result, the NAND gate 40 transfers the supply voltage Vcc to the eighth node N8 to turn off the switching transistor MP7 connected between the sixth and seventh nodes N6 and N7. Also, the supply voltage Vcc at the eighth node N8 turns on the NMOS transistor MN12 in the third inverter circuit 13, thereby causing the PMOS and NMOS transistors MP9 and MN13 of the transfer gate connected between the fourth and thirteenth nodes N4 and N13 to be turned off. At this time, a low logic signal at the twelfth node N12 turns on the PMOS transistor MP10 to make a signal at the thirteenth node N13 high in logic. The high logic signal at the thirteenth node N13 turns on the low voltage transfer transistor MN8. Therefore, the word line WL can stably be maintained at the ground voltage state Vss.

On the other hand, when the signal at the eighth node N8 is low in logic, the switching transistor MN7 is turned on to connect the power lines of the sixth and seventh nodes N6 and N7 with each other. At this time, the PMOS transistor MP8 in the third inverter circuit 13 is turned on to turn on the PMOS and NMOS transistors MP9 and MN13 of the transfer gate connected between the fourth and thirteenth nodes N4 and N13. As a result, the signal at the fourth node N4 is transferred to the thirteenth node N13. At this time, the PMOS transistor MP10 is turned off.

Figure 4:
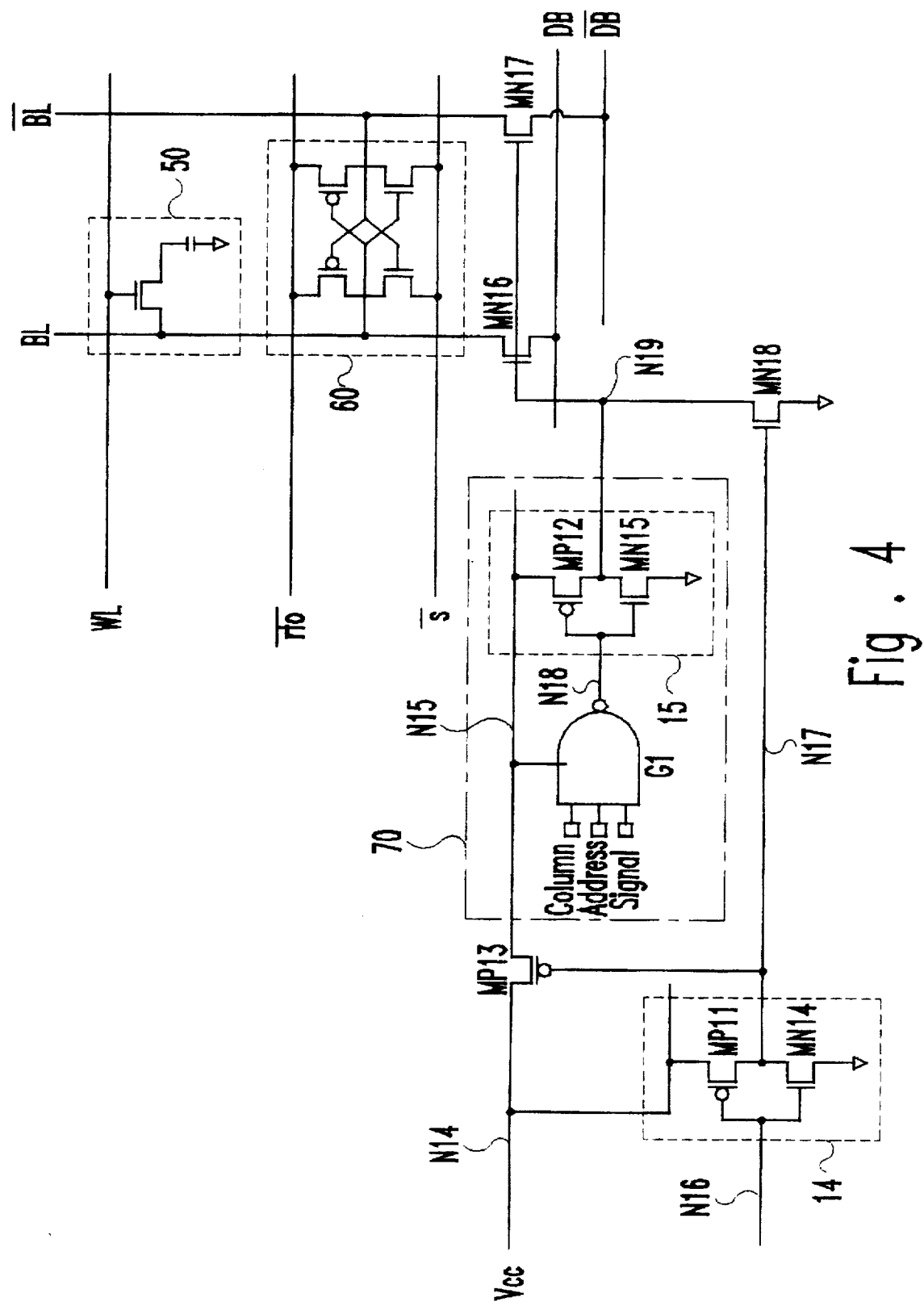
FIG. 4 is a circuit diagram illustrating the construction of a column decoder circuit for a semiconductor memory device in accordance with a third embodiment of the present invention.

FIG. 4 is a circuit diagram illustrating the construction of a column decoder circuit for a semiconductor memory device in accordance with a third embodiment of the present invention. As shown in this drawing, the column decoder circuit comprises transfer transistors or NMOS transistors MN16 and MN17 for transferring data from true and complementary bit lines BL and /BL to true and complementary data bus lines DB and /DB or vice versa, respectively. The column decoder further comprises a column decoder 70 for decoding a column address to control the transfer transistors MN16 and MN17, a first switching transistor or NMOS transistor MN18 for transferring the ground voltage Vss to a nineteenth node or output node N19 of the column decoder 70, a fourteenth node N14 connected to a first power line acting as a source of the supply voltage Vcc, a fifteenth node N15 connected to a second power line for transferring the supply voltage Vcc from the fourteenth node N14 to the column decoder 70, a second switching transistor or PMOS transistor MP13 connected between the fourteenth and fifteenth nodes N14 and N15, and an inverter circuit 14 for controlling the first and second switching transistors MN18 and MP13. The transfer transistor MN16 is connected between the true bit line BL and the true data bus line DB and has its gate connected to the output node N19 of the column decoder 70, and the transfer transistor MN17 is connected between the complementary bit line /BL and the complementary data bus line /DB and has its gate connected to the output node N19 of the column decoder 70.

The column decoder 70 includes a NAND gate G1 for NANDing column address bits and outputting the NANDed result to an eighteenth node N18, and an inverter circuit 15 for inverting a signal at the eighteenth node N18 and outputting the inverted signal to the nineteenth node N19. The inverter circuit 15 is provided with a PMOS transistor MP12 connected between the fifteenth node N15 and the nineteenth node N19 and has its gate connected to the eighteenth node N18, and an NMOS transistor MN15 connected between the nineteenth node N19 and the ground voltage Vss and has its gate connected to the eighteenth node N18.

The inverter circuit 14 includes a PMOS transistor MP11 connected between the fourteenth node N14 and a seventeenth node N17 and has its gate connected to a sixteenth node N16, and an NMOS transistor MN14 connected between the seventeenth node N17 and the ground voltage Vss and has its gate connected to the sixteenth node N16.

The first and second switching transistors MN18 and MP13 have their gates connected in common to the seventeenth node N17.

The operation of the column decoder circuit with the above-mentioned construction in accordance with the third embodiment of the present invention will hereinafter be described in detail.

If the output signal from the inverter circuit 14 is high in logic according to a logic state of an input signal at the sixteenth node N16, the second switching transistor MP13 connected between the fourteenth and fifteenth nodes N14 and N15 is turned off. As a result, the supply voltage Vcc from the first power line of the fourteenth node N14 is not transferred to the second power line of the fifteenth node N15 so that the column decoder 70 cannot be operated. Also, the first switching transistor MN18 is turned on in response to the high logic signal at the output node N17 of the inverter circuit 14, thereby causing a signal at the output node N19 of the column decoder 70 to have the ground voltage level Vss. As a result, the transfer transistors MN16 and MN17 are turned off in response to the low logic signal at the output node N19 of the column decoder 70. Therefore, when the power line is cut off, the output signal from the column decoder 70 can stably be maintained at the ground voltage state Vss so that the transfer transistors MN16 and MN17 cannot be operated.

On the other hand, when the signal at the seventeenth node N17 is low in logic, the second switching transistor MP13 is turned on to connect the first and second power lines of the fourteenth and fifteenth nodes N14 and N15 with each other. As a result, the column decoder 70 is operated to generate a high logic signal at the nineteenth node N19 which turns on the transfer transistors MN16 and MN17. After being turned on, the transfer transistors MN16 and MN17 transfer data from the true and complementary bit lines BL and /BL to the true and complementary data bus lines DB and /DB or vice versa, respectively.

As is apparent from the above description, according to the present invention, when the word line is not driven, the main power line is separated from the row decoder circuit to block the power from the main power line to the row decoder circuit. Therefore, the amount of standby current consumption can be reduced. Also, when the bit line is not selected, the main power line is separated from the column decoder circuit to block the power from the main power line to the column decoder circuit. Therefore, the amount of standby current consumption can be reduced. Further, the present invention is applicable to all of semiconductor memory devices employing the row and column decoder circuits, such as DRAM, SRAM and ROM.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A row decoder circuit for a semiconductor memory device which has a plurality of memory cells each including one MOS transistor and one capacitor, comprising:

main row decoding means for decoding a row address to select a word line corresponding to the row address;

at least two sub row decoding means for supplying a high or low voltage to corresponding word lines in response to an output signal from said main row decoding means;

a first power line acting as a source of a supply voltage;

a second power line for transferring the supply voltage from said first power line to said main row decoding means;

first switching means connected between said first and second power lines;

second switching means for switching a corresponding word line to a ground voltage when said first switching means is turned off; and switching control means for controlling said first and second switching means.

2. A row decoder circuit for a semiconductor memory device, as set forth in claim 1, wherein said first switching means include a MOS transistor.

3. A row decoder circuit for a semiconductor memory device, as set forth in claim 2, wherein said MOS transistor is of a P type.

4. A row decoder circuit for a semiconductor memory device, as set forth in claim 1, wherein said second switching means include a MOS transistor.

5. A row decoder circuit for a semiconductor memory device, as set forth in claim 4, wherein said MOS transistor is of an N type.

6. A row decoder circuit for a semiconductor memory device, as set forth in claim 1, wherein said switching control means include a NAND gate.

7. A row decoder circuit for a semiconductor memory device which has a plurality of memory cells each including one MOS transistor and one capacitor, comprising:

> main row decoding means for decoding a row address to select a word line corresponding to the row address and outputting the decoded result to a first or second node;
>
> at least two sub row decoding means each including a high voltage transfer driver for transferring a high voltage to a corresponding word line in response to a signal at said first node, and a low voltage transfer driver for transferring a low voltage to the corresponding word line in response to a signal at said second node;
>
> a first power line acting as a source of a supply voltage;
>
> a second power line for transferring the supply voltage from said first power line to said main row decoding means;
>
> first switching means connected between said first and second power lines;
>
> second switching means for transferring the signal at said second node to said low voltage transfer driver when said first switching means is turned on;
>
> first switching control means for controlling said second switching means; and
>
> second switching control means for controlling said first switching means and said first switching control means.

8. A row decoder circuit for a semiconductor memory device, as set forth in claim 7, wherein said high and low voltage transfer drivers include NMOS transistors, respectively.

9. A row decoder circuit for a semiconductor memory device, as set forth in claim 7, wherein said first switching means include a MOS transistor.

10. A row decoder circuit for a semiconductor memory device, as set forth in claim 9, wherein said MOS transistor is of a P type.

11. A row decoder circuit for a semiconductor memory device, as set forth in claim 7, wherein said second switching means is a transfer gate including an NMOS transistor and a PMOS transistor.

12. A row decoder circuit for a semiconductor memory device, as set forth in claim 7, wherein said first switching control means include an inverter circuit.

13. A row decoder circuit for a semiconductor memory device, as set forth in claim 7, wherein said second switching control means include a NAND gate.

14. A column decoder circuit for a semiconductor memory device which has a plurality of memory cells each including one MOS transistor and one capacitor, comprising:

> a pair of data transfer transistors for transferring data from true and complementary bit lines to true and complementary data bus lines or vice versa, respectively;
>
> column decoding means for decoding a column address to control said data transfer transistors;
>
> a first power line acting as a source of a supply voltage;
>
> a second power line for transferring the supply voltage from said first power line to said column decoding means;
>
> first switching means connected between said first and second power lines;
>
> second switching means for switching an output node of said column decoding means to a ground voltage when said first switching means is turned off; and
>
> switching control means for controlling said first and second switching means.

15. A column decoder circuit for a semiconductor memory device, as set forth in claim 14, wherein said data transfer transistors are NMOS transistors.

16. A column decoder circuit for a semiconductor memory device, as set forth in claim 14, wherein said first switching means include a MOS transistor.

17. A column decoder circuit for a semiconductor memory device, as set forth in claim 16, wherein said MOS transistor is of a P type.

18. A column decoder circuit for a semiconductor memory device, as set forth in claim 14, wherein said second switching means include an NMOS transistor.

19. A column decoder circuit for a semiconductor memory device, as set forth in claim 14, wherein said switching control means include an inverter circuit.

* * * * *